(12) United States Patent
Chien

(10) Patent No.: US 10,989,969 B2
(45) Date of Patent: Apr. 27, 2021

(54) DISPLAY PANEL AND MANUFACTURING METHOD THEREOF

(71) Applicants: HKC Corporation Limited, Guangdong (CN); Chongqing HKC Optoelectronics Technology Co., Ltd., Chongqing (CN)

(72) Inventor: Chung-Kuang Chien, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/628,632

(22) PCT Filed: Oct. 16, 2017

(86) PCT No.: PCT/CN2017/106298
§ 371 (c)(1),
(2) Date: Jan. 3, 2020

(87) PCT Pub. No.: WO2019/006904
PCT Pub. Date: Jan. 10, 2019

(65) Prior Publication Data
US 2020/0124890 A1 Apr. 23, 2020

(30) Foreign Application Priority Data

Jul. 6, 2017 (CN) .......................... 201710546316.4

(51) Int. Cl.
*G02F 1/1362* (2006.01)
*G02F 1/1339* (2006.01)
(Continued)

(52) U.S. Cl.
CPC ........ *G02F 1/1362* (2013.01); *G02F 1/13392* (2013.01); *G02F 1/13439* (2013.01);
(Continued)

(58) Field of Classification Search
CPC ................. G02F 1/13394; G02F 2001/136222
See application file for complete search history.

(56) References Cited

U.S. PATENT DOCUMENTS

2002/0033927 A1* 3/2002 Mun ................. G02F 1/133345
349/156
2007/0184612 A1* 8/2007 Chan ................... G02F 1/13394
438/257
(Continued)

FOREIGN PATENT DOCUMENTS

CN 200941140 Y 8/2007
CN 104086748 A 10/2014
(Continued)

*Primary Examiner* — Alexander P Gross
(74) *Attorney, Agent, or Firm* — Muncy, Geissler, Olds & Lowe, P.C.

(57) ABSTRACT

The present invention discloses a display panel. The display panel comprises a substrate, a plurality of active switches disposed on the substrate, a color filter layer formed on the active switches, and a transparent photoresist layer formed on and covering the color filter layer. The transparent photoresist layer comprises a protective layer and at least one photo spacer.

9 Claims, 8 Drawing Sheets

(51) Int. Cl.
*G02F 1/1343* (2006.01)
*H01L 27/12* (2006.01)
(52) U.S. Cl.
CPC .... *H01L 27/1288* (2013.01); *G02F 1/136222* (2021.01); *G02F 1/136236* (2021.01)

(56) References Cited

U.S. PATENT DOCUMENTS

| | | | |
|---|---|---|---|
| 2012/0057111 A1* | 3/2012 | Ohkubo | G02F 1/133514 349/106 |
| 2015/0198837 A1* | 7/2015 | Kim | G02F 1/13624 349/43 |
| 2018/0275471 A1* | 9/2018 | Park | G02F 1/136227 |
| 2019/0258164 A1* | 8/2019 | Tanigaki | G03F 7/168 |
| 2020/0312888 A1* | 10/2020 | Okabe | H05B 33/22 |

FOREIGN PATENT DOCUMENTS

| | | |
|---|---|---|
| CN | 106773240 A | 5/2017 |
| CN | 106773242 A | 5/2017 |

* cited by examiner

DISPLAY PANEL AND MANUFACTURING METHOD THEREOF

BACKGROUND

Field of Invention

The present invention relates to a display technology, and especially relates to a display panel and a manufacturing method thereof.

Related Art

The Liquid crystal display has many advantages including a slim body, the power saving property and the radiation-free property and is widely applied. The liquid crystal displays currently available are primarily the backlight-typed liquid crystal display which comprises a liquid crystal panel and a backlight module. The work principle of the liquid crystal display is that the liquid crystal molecules are placed between two parallel glass substrates, and a driving voltage is applied to the two glass substrates to control the rotating directions of the liquid crystal molecules so as to refract the light from the backlight module to generate an image.

A thin film transistor-liquid crystal display (TFT-LCD) has advantages such as low energy consumption, excellent image quality, high production yield and the like, and has now gradually occupied the dominant position in the display field. Similarly, the TFT-LCD includes the display panel and the backlight module. The display panel includes a color filter substrate (CF substrate) and a thin film transistor substrate (TFT substrate), and a transparent electrode is disposed on the opposing inner side of each of the above-mentioned substrates. A layer of liquid crystal (LC) molecules is disposed between the two substrates. The display panel controls orientations of the liquid crystal molecules by an electric field to change the polarization state of light, and utilizes polarizers to allow the light to penetrate therethrough or to block the light to implement the objective of display.

For the currently available display panels, it have to disposed a protective layer after the manufacturing of the color filter layer, so as to protect the color filter layer and other structures which have been made. Hence, the manufacturing process of the display panel is very complicated, and therefore the manufacturing cost is increased.

SUMMARY OF THE INVENTION

The technical problem to be solved by the present disclosure is to provide a display panel which is manufactured by a method with an effectively reduced number of process.

In addition, the present disclosure further provides a method of manufacturing the display panel.

To achieve the above objective, a display panel is provided. The display panel comprises a substrate, a plurality of active switches disposed on the substrate, a color filter layer formed on the active switches, and a transparent photoresist layer formed on and covering the color filter layer. The transparent photoresist layer comprises a protective layer and at least one photo spacer.

In one embodiment, the transparent photoresist layer is constituted by a composite negative photoresist material layer. The composite negative photoresist material layer comprises a transparent protective layer and a negative photoresist layer. The transparent protective layer and the negative photoresist layer are disposed in a stacked manner. In such configuration, via disposing one transparent photoresist layer and one negative photoresist layer, the transparent protective layer has the insulating property required for the insulation material and the negative photoresist layer may have an excellent hardness which may provide an effective supporting effect to the substrate. Defects of dark spots occurred upon lighting are further reduced. The display performance of the display panel may be enhanced and the image quality of the display panel is also increased. The composite negative photoresist material layer is placed on the color filter layer and may effectively substitute the protective layer and the photo spacers. Such configuration may effectively simplified the manufacturing process of the display panel and is beneficial to reduce the number of the manufacturing process and the manufacturing time of the display panel, which may further increase the production efficiency of the display panel.

In one embodiment, the transparent photoresist layer is constituted by a mixed negative photoresist material layer. The mixed negative photoresist material layer is formed by mixing of a transparent protective material and a negative photoresist material. In such configuration, the disposing of the mixed negative photoresist material layer can effectively substitute the transparent protective material and the negative photoresist material on the color filter layer. The transparent photoresist layer may be effectively disposed through just one photo-masking process, which may optimize and reduce the number of the manufacturing process of the display panel.

In one embodiment, a transparent electrode layer is disposed on the transparent photoresist layer, and the photo spacer is disposed in a manner of penetrating through the transparent electrode layer. Accordingly, the transparent electrode layer is disposed on the transparent photoresist layer to ensure that the transparent electrode layer may work well. The disposing of the transparent electrode layer and the photo spacers is implemented through just two manufacturing processes, which may optimize and reduce the number of the manufacturing process of the display panel.

According to another aspect of the present disclosure, a method of manufacturing a display panel is also disclosed. The display panel comprises a substrate, a plurality of active switches disposed on the substrate and a color filter layer disposed on the active switches. The method comprises the following steps: disposing a composite negative photoresist material layer or a mixed negative photoresist material layer on the color filter layer; and obtaining a transparent photoresist layer which covers the color filter layer through a photo-masking process.

Accordingly, through a simple photo-masking process, the transparent photoresist layer of the display panel can be well made, and the protective layer and the photo spacers can be made simultaneously in a one-time completed manner. The transparent photoresist layer may effectively substitute the protective layer and the photo spacers. The disposing of the composite negative photoresist material layer, which has an insulating property, on the color filter layer may effectively simplified the manufacturing process of the display panel and is beneficial to reduce the number of the manufacturing process and the manufacturing time of the display panel, which may further increase the production efficiency of the display panel. In addition, the manufacturing cost of the display panel may be effectively reduced, which may further enhance the commercial competitiveness of the display panel.

In one embodiment, the photomask used in the photo-masking process is a multi-tone photomask. Here, the multi-tone photomask can be classified to two categories which are half-tone masks and gray-tone masks. The grayscale photomask comprises micro-slits which are finer than the resolution of the exposure machine, such that semi-exposure is possible because part of the light is shielded by such slits.

In one embodiment, the composite negative photoresist material layer comprises a transparent protective layer and a negative photoresist layer. The composite negative photoresist material layer is made by the steps of: supplying a transparent protective material to a bottom of a mold; supplying a negative photoresist material on the transparent protective material in the mold; and obtaining the composite negative photoresist material layer which is in a transparent dual-layered structure through a photo-curing procedure and a thermal-reaction method.

Accordingly, the transparent photoresist layer can be effectively formed through adopting the half-tone mask or the gray-tone mask, and may effectively substitute the protective layer and the photo spacers. It may effectively simplified the manufacturing process of the display panel and is beneficial to reduce the number of the manufacturing process and the manufacturing time of the display panel, which may further increase the production efficiency of the display panel.

In one embodiment, the composite negative photoresist material layer is a single-layered mixed negative photoresist material layer which comprises a transparent protective material and a negative photoresist material. The mixed negative photoresist material layer is made by the steps of: supplying a mixture of a transparent protective material and a negative photoresist material into a mold; and obtaining the mixed negative photoresist material layer which is in a transparent single-layered structure through a photo-curing procedure and a thermal-reaction method.

Accordingly, the transparent photoresist layer may be simply and effectively disposed through just one photo-masking process, which may optimize and reduce the number of the manufacturing process of the display panel.

In one embodiment, during obtaining the transparent photoresist layer which covers the color filter layer through the photo-masking process, the method comprises: forming a photosensitive layer on the composite negative photoresist layer or the mixed negative photoresist material layer; obtaining a pattern of the transparent photoresist layer through the photo-masking process; obtaining the transparent photoresist layer by etching with an etchant; and removing residual photosensitive layer.

Accordingly, through the disposing of the transparent photoresist layer, the number of the manufacturing process of the display panel can be effectively optimized and reduced.

In one embodiment, after obtaining the transparent photoresist layer which covers the active switches through the photo-masking process, the method further comprises: forming a transparent electrode material layer which covers the transparent photoresist layer; forming a photosensitive layer on the transparent electrode layer material layer; obtaining a pattern of the transparent electrode layer through the photo-masking process; obtaining the transparent electrode layer by etching with an etchant; and removing residual photosensitive layer.

According to another aspect of the present disclosure, a display device is also disclosed. The display device comprises the aforementioned display panel.

In the present disclosure, due to the effective insulating properties provided by the transparent photoresist layer, the conventional process which requires to dispose a protective layer on the photoresist layer of a traditional color filter on array substrate. The number of the manufacturing process of the display panel is effectively optimized and reduced, which prompts that the display panel can be manufactured more conveniently. It is beneficial to reduce the number of the manufacturing process and the manufacturing time of the display panel, which may further increase the production efficiency of the display panel. The process of disposing the protective layer on the photoresist layer is omitted, which can effectively save the manufacturing cost of the display panel and further enhance the commercial competiveness of the display panel. In addition, the photoresist layer has a relatively higher photosensitivity and greater transmittance, which can effectively substitute the photo spacers. By adopting the half-tone mask or the gray-tone mask, the protective layer and the photo spacers can be made simultaneously in a one-time completed manner, such that the disposing of the transparent photoresist layer is simple and convenient. It may well simplified the manufacturing process of the display panel and may further increase the production efficiency of the display panel.

DETAILED DESCRIPTION OF THE INVENTION

Figure 1:
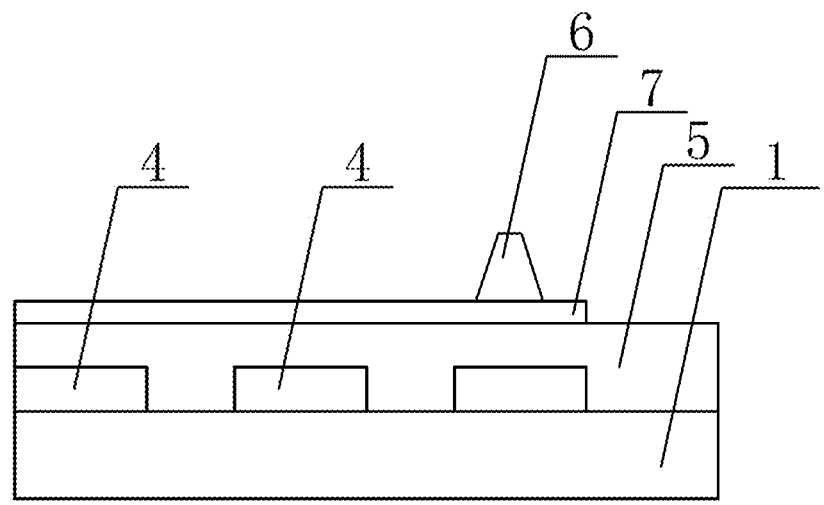
FIG. 1 is a cross-sectional view of an exemplary display panel.

Specific structural and functional details disclosed herein are merely representative and are for purposes of describing example embodiments of the present invention. However, the present invention may be embodied in many alternate forms, and should not be interpreted as being limited to the embodiments set forth herein.

In the description of the present invention, it is to be understood that the term "center", "lateral", "upper", "lower", "left", "right", "vertical", "horizontal", "top", "bottom", "inner", "outer" and other indicated orientation or positional relationships are based on the location or position relationship shown in the drawings, and are for convenience of description of the present invention only and to simplify the description, and not indicate or imply that refers to devices or elements must have a specific orientation, the orientation of a particular configuration and operation, therefore, cannot be construed as limiting the present invention. In addition, the terms "first", "second" are used to indicate or imply relative importance or the number of technical features specified implicitly indicated the purpose of description and should not be understood. Thus, there is defined "first", "second" features may be explicitly or implicitly include one or more of the features. In the description of the present invention, unless otherwise specified, the meaning of "more" is two or more. Further, the term "comprising" and any variations thereof, are intended to cover non-exclusive inclusion.

In the description of the present invention, it is noted that, unless otherwise expressly specified or limited, the terms "mounted," "connected to", "connected" are to be broadly understood, for example, may be a fixed connection, may be a detachable connection, or integrally connected; may be a mechanical connector may be electrically connected; may be directly connected, can also be connected indirectly through intervening structures, it may be in communication the interior of the two elements. Those of ordinary skill in the art, be appreciated that the specific circumstances of the specific meanings in the present invention.

The terminology used herein is for describing particular embodiments only and is not intended to limit embodiments to an exemplary embodiment. Unless the context clearly indicates otherwise, singular forms as used herein, "a", "an" are intended to include the plural. It should also be understood that, as used herein the term "comprising" and/or "comprising," as used herein, specify the presence of stated features, integers, steps, operations, elements, and/or components, but do not preclude the presence or addition of one or more other features, integers, steps, operations, elements, components, and/or combinations thereof.

This disclosure will be further described in detail with reference to the accompanying drawings and specific embodiments below.

As shown in FIG. 1, an exemplary display panel is provided. The display panel comprises a substrate 11, a plurality of active switches 2 and a color filter layer 4. The active switches 2 are disposed on the substrate 11. The color filter layer 4 is formed on the active switches 2. A protective layer 5 is disposed on and covers the color filter layer 4. A transparent electrode layer 6 is disposed on the protective layer 5. At least one photo spacer 6 is disposed on the transparent electrode layer 6. The protective layer 5 may provide an effective protection to the photoresist layer 4 and effectively prevent the photoresist layer 4 from a direct corrosion of a washing reagent in the subsequent manufacturing process. Costs of scraps are effectively reduced. The image quality of the display panel is further increased. The photo spacer 6 may provide a good supporting property, which ensures the liquid crystals in the liquid crystal cell may work efficiently.

Figure 2:
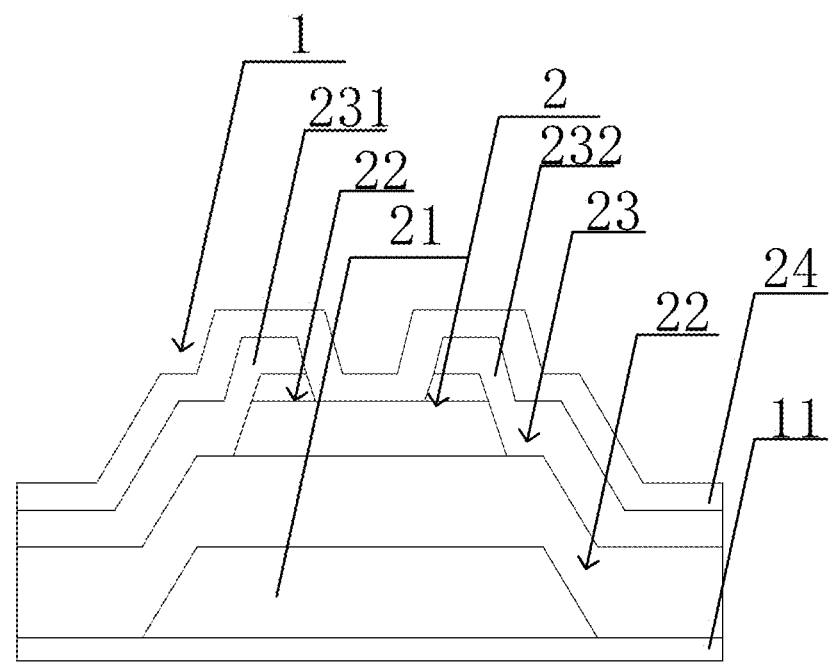
FIG. 2 is a cross-sectional view demonstrating the structure of an exemplary first substrate assembly.

As shown in FIG. 2, the first substrate assembly 1 comprises the substrate 11 and the active switches 2. The active switches 2 comprise a gate 21 which is disposed on the substrate 11, a passivation layer disposed on the gate 21, a semi-conductive layer 22 disposed on the passivation layer, a metal layer 23 disposed on the semi-conductive layer 22 (the metal layer 23 comprises a source 231 and a drain 232), and an insulation layer 24 disposed on the metal layer 23. The insulation layer 24 may provide an effective protection to the active switches 2 and effectively prevent the sources 231 and the drains 232 of the active switches 2 from a direct corrosion of a washing reagent in the subsequent manufacturing process, such that the source 231 and the drain 232 may be remained intact and the possibility of breaking wire may be reduced. Costs of scraps are effectively reduced. The image quality of the display panel is further increased. In addition, the sources 231 and the drains 232 of the active switches 2 are both made of metal materials. From a side view, the source 231 and the drain 232 both have metallic burr microstructures. The insulation layer 24 may further protect the source 231 and the drain 232 to prevent them from impacts caused by the subsequent manufacturing process, which may effectively increase the yield of the display panel.

Figure 3:
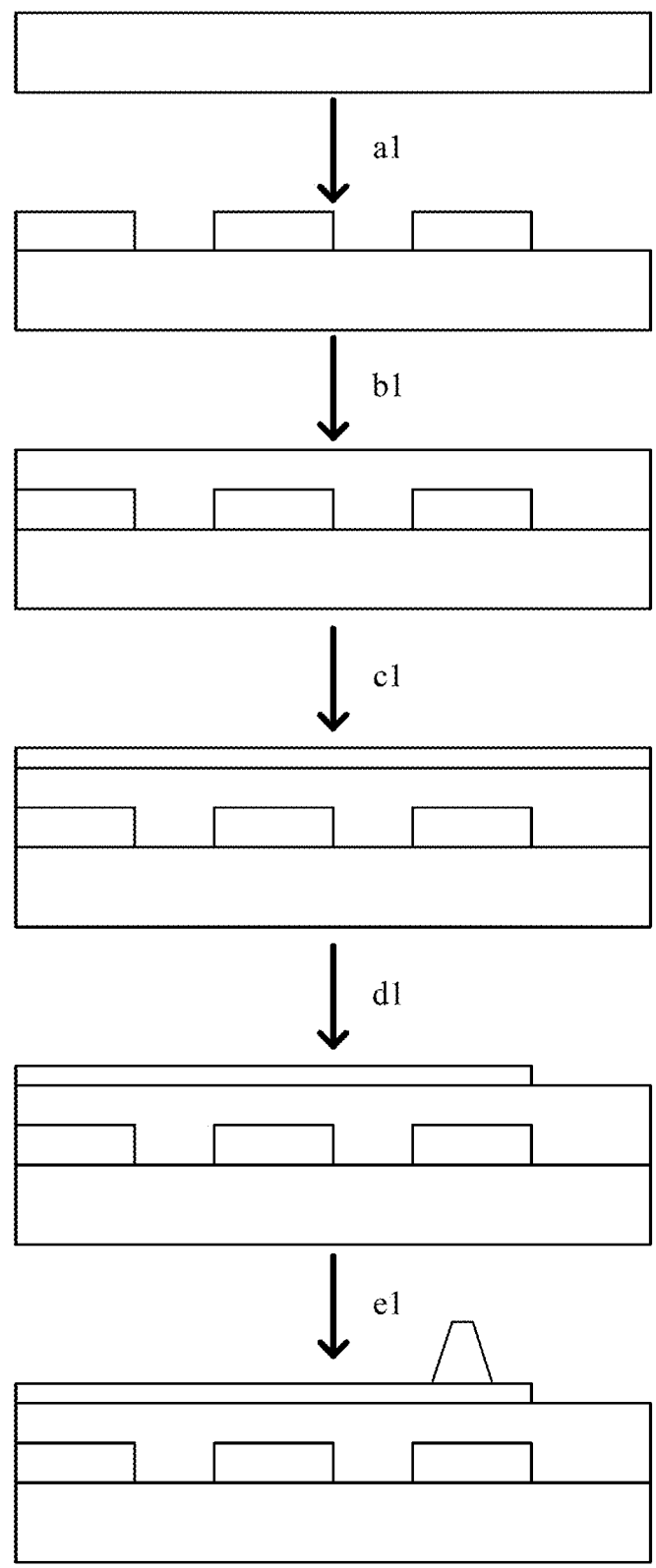
FIG. 3 is a flow chart of the method of manufacturing the exemplary display panel.

As shown in FIG. 3, the color filter layer 4 is formed through a color resist process a1 performed on the insulation layer 24 of the first substrate assembly 1. Later, the protective layer 5 is then formed through an insulation process b1 performed on the color filter layer 4. Later, the transparent electrode material layer is formed through a sputtering method c1 for the transparent electrode layer performed on the protective layer 5. The transparent electrode layer 7 is formed through a lithographic process d1 performed on the transparent electrode material layer. The photo spacer 6 is formed through a photo-spacer manufacturing process e1 performed on the transparent electrode layer 7.

It can be further found that, the manufacturing of the protective layer 5, the transparent electrode layer 7 and photo spacer 6 requires three steps, or more. It is relative complicated and requires more cost. It also tends to cause operational errors which results in a low yield of the display panel. Hence, the present disclosure provides a technical solution to effectively reduce the number of the manufacturing process.

The disclosure will be further described in detail with reference to FIGS. 4 and 5 and specific embodiments below.

Figure 4:
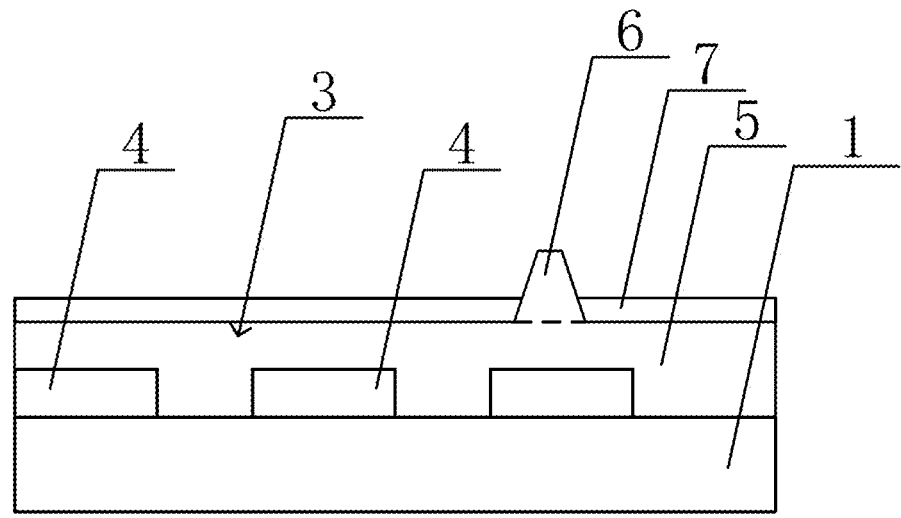
FIG. 4 is a cross-sectional view of a display panel according to another embodiment of the present disclosure.

As shown in FIG. 4, the display panel comprises a substrate 11, a plurality of active switches 2 disposed on the substrate 11, a color filter layer 4 formed on the active switches 2. A transparent photoresist layer 3 is formed on and covers the color filter layer 4. The transparent photoresist layer 6 comprises a protective layer 5 and at least one photo spacer 6.

Due to the effective insulating properties provided by the transparent photoresist layer 3, the conventional process which requires to dispose a protective layer 5 on the photoresist layer 4 of a traditional color filter on array (COA) substrate is omitted. The number of the manufacturing process of the display panel is effectively optimized and reduced, which prompts that the display panel can be manufactured more conveniently. It is beneficial to reduce the number of the manufacturing process and the manufacturing time of the display panel, which may further increase the production efficiency of the display panel. The omission of the process of disposing the protective layer 5 on the photoresist layer 4 can effectively save the manufacturing cost of the display panel and further enhance the commercial competiveness of the display panel. In addition, the photoresist layer 3 has a relatively higher photosensitivity and greater transmittance, which can effectively substitute the photo spacer 6. By adopting the half-tone mask or the gray-tone mask, the protective layer 5 and the photo spacer 6 can be made simultaneously in a one-time completed manner, such that the disposing of the transparent photoresist layer 3 is simple and convenient. It may well simplified the manufacturing process of the display panel and may further increase the production efficiency of the display panel.

Figure 8:
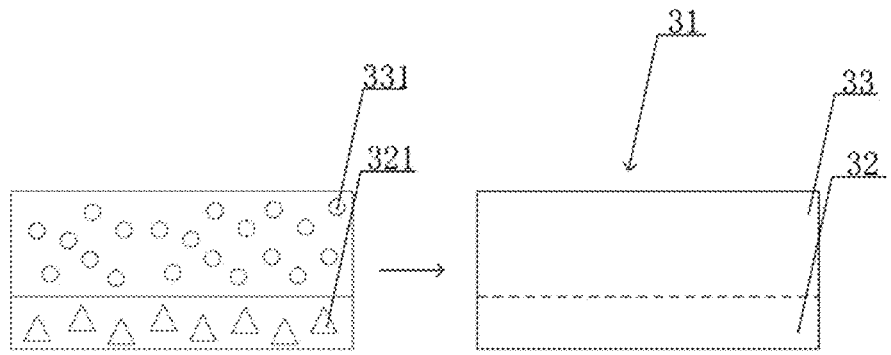
FIG. 8 is a schematic diagram of the method of manufacturing a dual-layered transparent composite negative photoresist material layer according to one embodiment of the present disclosure.

As shown in FIG. 8, the transparent photoresist layer 3 is constituted by a composite negative photoresist material layer 31. The composite negative photoresist material layer 31 comprises a transparent protective layer 32 and a negative photoresist layer 33. The transparent protective layer 32 and the negative photoresist layer 33 are disposed in a stacked manner. Via disposing one transparent photoresist layer 32 and one negative photoresist layer 33, the transparent protective layer 32 has the insulating property required for the insulation material and the negative photoresist layer 33 may have an excellent hardness which may provide an effective supporting effect to the substrate 11. Defects of dark spots occurred upon lighting are further reduced. The display panel may have an advanced display performance and the image quality of the display panel is also increased. The negative photoresist layer 33 further has a high transmittance and contrast, which ensures that the display panel has more a homogeneous color and luminance and effectively enhance the quality of the display panel. The transparent protective layer 32 and the negative photoresist layer 33 are disposed in a stacked manner, where the transparent protective layer 32 is disposed at the lower layer and the negative photoresist layer 33 is disposed at the upper layer. The composite negative photoresist material layer 31 is placed on the color filter layer 4. By adopting the half-tone mask or the gray-tone mask, the photoresist layer 3 can be effectively formed which may effectively substitute the protective layer 5 and the photo spacer 6. Such configuration may effectively simplified the manufacturing process of the display panel and is beneficial to reduce the number of the manufacturing process and the manufacturing time of the display panel, which may further increase the production efficiency of the display panel. The transparent protective layer 32 may efficiently protect the photoresist layer 4 and effectively prevent the photoresist layer 4 from a direct corrosion of a washing reagent in the subsequent manufacturing process. Costs of scraps are effectively reduced. The image quality of the display panel is further increased. The transparent protective layer 32 is optionally constituted by the transparent protective material 321 and the transparent protective material 321 can be transparent resins or the like. The negative photoresist layer is optionally constituted by the negative photoresist material 331 and the negative photoresist material 331 can be the photosensitive polymers which are primarily acrylates or epoxy.

Figure 5:
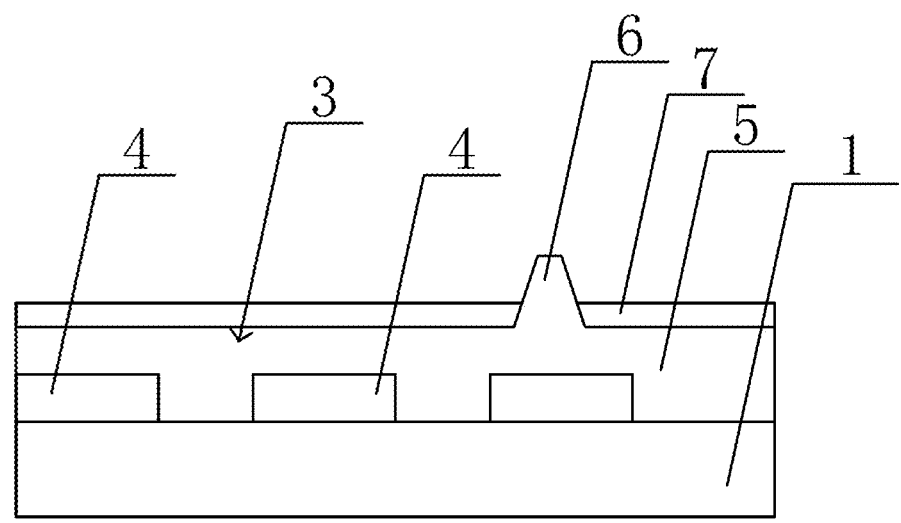
FIG. 5 is a cross-sectional view of a display panel according to another embodiment of the present disclosure.

As shown in FIG. 5, the transparent photoresist layer 3 is constituted by a mixed negative photoresist material layer 34. The mixed negative photoresist material layer 34 is formed by mixing of a transparent protective material 321 and a negative photoresist material 331. Through disposing the mixed negative photoresist material layer 34, it can effectively substitutes the transparent protective material and the negative photoresist material disposed on the color filter layer 4. By adopting the half-tone mask or the gray-tone mask, the photoresist layer 3 can be effectively formed. The transparent photoresist layer 3 may be effectively disposed through just one photo-masking process, which may optimize and reduce the number of the manufacturing process of the display panel. The omission of the process of disposing the protective layer 5 or photo spacers on the photoresist layer 4 can effectively save the manufacturing cost of the display panel and further enhance the commercial competiveness of the display panel. In addition, such configuration that the photo spacer 6 and the protective layer 5 are formed integrally may ensure that the liquid crystals in the liquid crystal cell can work efficiently. Hence, the display panel is ensured to have a more homogeneous color and luminance, and the image quality of the display panel is further enhanced, so as to further enhance the commercial competiveness of the display panel.

In one embodiment, the transparent electrode layer 7 is disposed on the transparent photoresist layer 3, and the photo spacer 6 is disposed in a manner of penetrating through the transparent electrode layer 7. In other words, the transparent electrode layer 7 is not formed on the photo spacer 6. The transparent electrode layer 7 is disposed on the transparent photoresist layer 3 to ensure that the transparent electrode layer 7 may work well. The disposing of the transparent electrode layer 7 and the photo spacer 6 is implemented through just two manufacturing processes. Via the disposing of the transparent electrode layer 7 and the photo spacer 6, it can effectively prevent interference occurred between the transparent electrode layer 7 and the photo spacer 6 and secure the display effect of the display panel. In addition, it prompts the photo spacer 6 to keep an excellent supporting property, such that the display panel is ensured to have a more homogeneous color and luminance, and the display effect of the display panel is further enhanced, so as to further enhance the commercial competiveness of the display panel.

The composite negative photoresist material layer 31 or mixed photoresist material layer 34 is coated on the color filter layer 34. The photo spacer 6 and the protective layer 5 with the required thickness and shapes are obtained after the processes of exposing, developing, and backing, etc. Later, a substrate 11 having the photo spacer 6 is directly attached to another substrate 11, and then a liquid crystal cell is formed between the two photo spacer 6. The shape and the thickness of the photo spacer 6 is effectively controlled by a lithographic process, the control of the shape of the photomask, and the duration of the exposure. Hence, the photo spacer 6 is ensured to be able to provide an effective supporting property. Defects of dark spots occurred upon lighting are further reduced. The display panel may have an advanced display performance and the image quality of the display panel is also increased.

Figure 14:
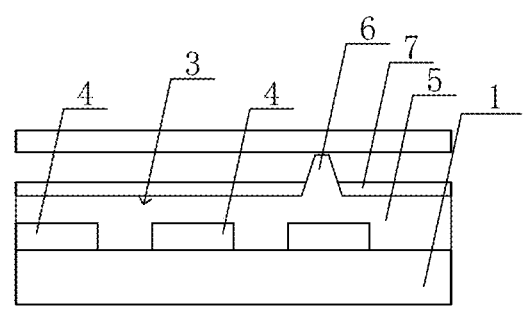
FIG. 14 is a cross-sectional view of a display panel according to one embodiment of the present disclosure.

As shown in FIG. 14, the first substrate assembly 1 is disposed parallel to the second substrate assembly. The photo spacer is disposed between the first substrate assembly 1 and the second substrate assembly. In addition, a liquid crystal layer (not shown) is also formed between the first substrate assembly 1 and the second substrate assembly. The first substrate assembly 1 or the second substrate assembly is optionally a color filter substrate or TFT array substrate. The transparent photoresist layer is disposed on the color filter substrate or TFT array substrate. The transparent photoresist layer comprises the protective layer and the photo spacer.

Figure 6:
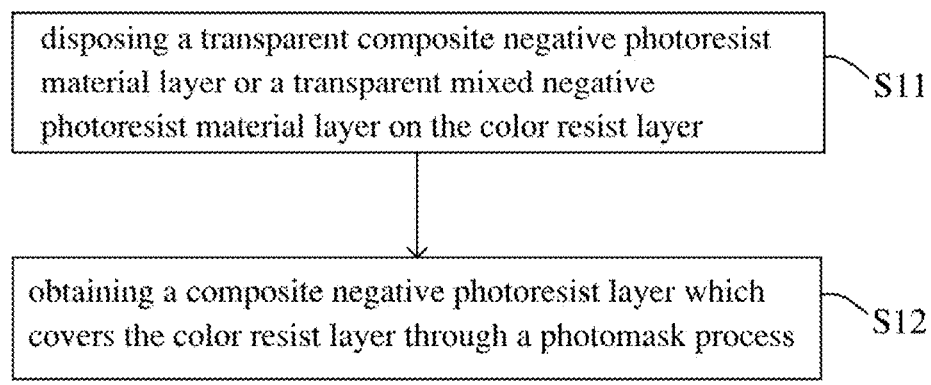
FIG. 6 is a flow chart of a method of manufacturing a display panel according to one embodiment of the present disclosure.

As shown in FIG. 6, the display panel comprises a substrate 11, the active switches 12 disposed on the substrate 11 and the color filter layer 4 disposed on the active switches 2. The method comprises the following steps. Step S11: disposing a composite negative photoresist material layer or a mixed negative photoresist material layer on the color filter layer. Step S12: obtaining a transparent photoresist layer which covers the color filter layer through a photo-masking process.

Accordingly, through a simple photo-masking process, the transparent photoresist layer 3 of the display panel can be well made, and the protective layer 5 and the photo spacer 6 can be made simultaneously in a one-time completed manner. The transparent photoresist layer 3 may effectively substitute the material of the protective layer 5 and the photo spacer. The disposing of the composite negative photoresist material layer 31, which has an insulating property, on the color filter layer 4 may effectively simplified the manufacturing process of the display panel and is beneficial to reduce the number of the manufacturing process and the manufacturing time of the display panel, which may further increase the production efficiency of the display panel. The characteristics of the transparent photoresist layer 3 are omitted here.

In one embodiment, the photomask used in the photo-masking process is a half-tone mask or a gray-tone mask. The multi-tone photomask can be classified to two categories which are half-tone masks and gray-tone masks. The grayscale photomask comprises micro-slits which are finer than the resolution of the exposure machine, such that semi-exposure is possible because part of the light is shielded by such slits. On the other hand, Half-tone masks make use of semitransparent films to make semi-exposure possible. Because the aforementioned two types may create three levels of exposure in one round of exposure, such as fully exposed, semi-exposed, and non-exposed areas. Hence, the photosensitive layer can be formed with two thicknesses after exposure. Using the difference between these thicknesses, a smaller number of photomasks can transfer patterns to the substrate 11 and thus increase the production efficiency of the panel. Because when the multi-tone photomasks are adopted, a comparative smaller number of photomasks can transfer patterns to material layers. It can shorten the manufacturing process of the display panel and thus increase the production efficiency of the panels. In addition, the image quality is also enhanced because the display panel may demonstrate a halftone.

Figure 7:
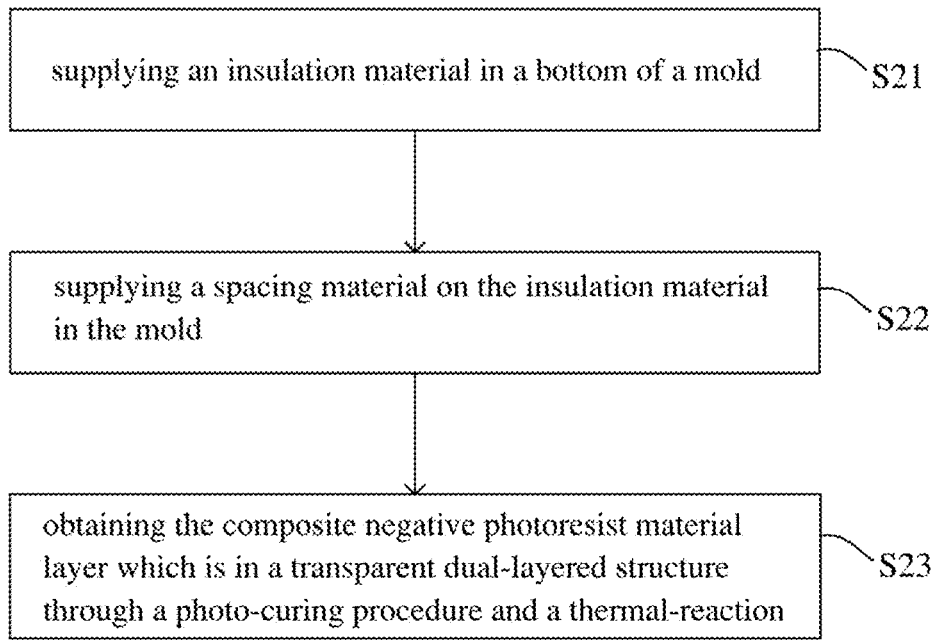
FIG. 7 is a flow chart of the method of manufacturing a dual-layered transparent composite negative photoresist material layer according to one embodiment of the present disclosure.

As shown in FIGS. 7 and 8, the composite negative photoresist material layer 31 comprises a transparent protective layer 32 and a negative photoresist layer 33. The composite negative photoresist material layer 31 is made by the following steps. Step S21: supplying a transparent protective material to a bottom of a mold. Step S22: supplying a negative photoresist material on the transparent protective material in the mold. Step S23: obtaining the composite negative photoresist material layer which is in a transparent dual-layered structure through a photo-curing procedure and a thermal-reaction method.

The transparent protective material 321 is supplied to the bottom of the mold. The negative photoresist material 331 is supplied on the transparent protective material 321. Through a photo-curing procedure and a thermal-reaction method, the composite negative photoresist material layer 31 which is in a transparent dual-layered structure is formed. The property of the transparent protective layer 32 is determined by the transparent protective material 321, and the property of the negative photoresist layer 33 is determined by the negative photoresist material 331. The transparent protective layer 32 at the lower layer of the composite negative photoresist material layer 31 has the insulating property required for the insulation material. The negative photoresist layer 33 at the upper layer of the composite negative photoresist material layer 31 has an excellent hardness, which is greater than or equal to 3H, may provide an effective supporting effect to the substrate 11. Defects of dark spots occurred upon lighting are further reduced. The display panel may have an advanced display performance and the image quality of the display panel is also increased. The negative photoresist layer 33 further has a high transmittance and contrast, which ensures that the display panel has a more homogeneous color and luminance and effectively enhance the quality of the display panel. The transparent protective layer 32 and the negative photoresist layer 33 are disposed in a stacked manner, where the transparent protective layer 32 is disposed at the lower layer and the negative photoresist layer 33 is disposed at the upper layer. The composite negative photoresist material layer 31 is placed on the color filter layer 4. By adopting the half-tone mask or the gray-tone mask, the photoresist layer 3 can be effectively formed which may effectively substitute the protective layer 5 and the photo spacer 6. Such configuration may effectively simplified the manufacturing process of the display panel and is beneficial to reduce the number of the manufacturing process and the manufacturing time of the display panel, which may further increase the production efficiency of the display panel.

Figure 9:
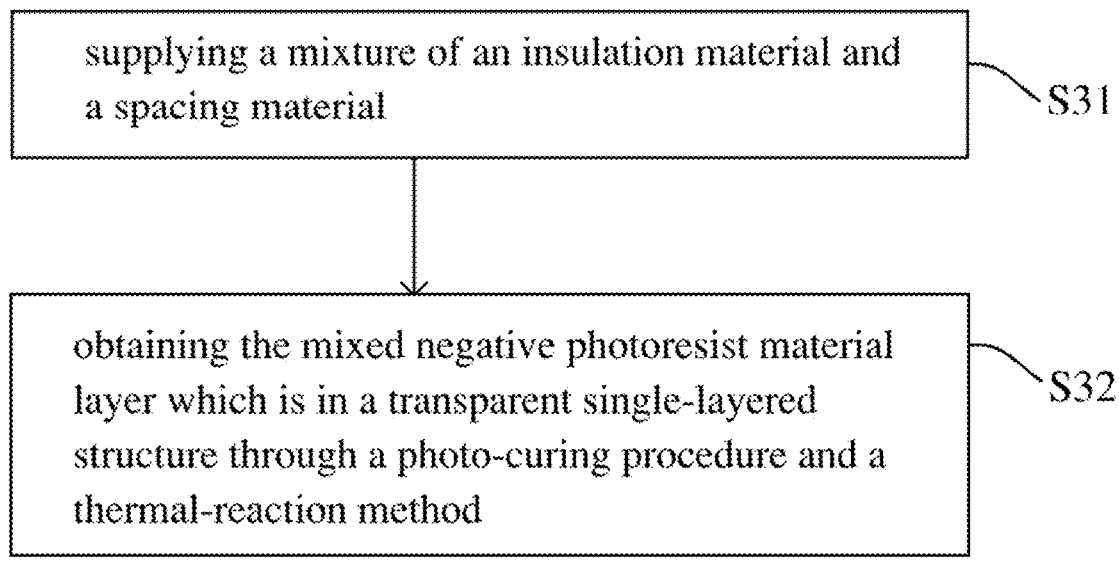
FIG. 9 is a flow chart of a method of manufacturing a single-layered transparent mixed negative photoresist material layer according to one embodiment of the present disclosure.
Figure 10:
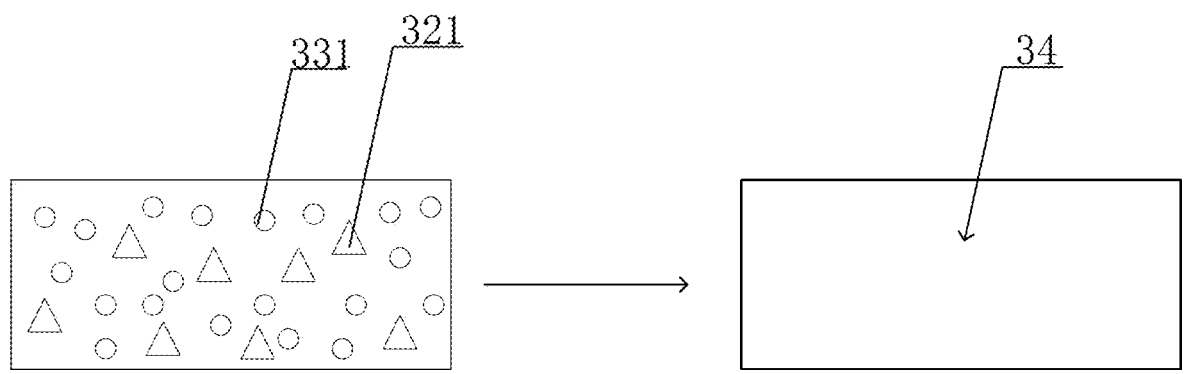
FIG. 10 is a schematic diagram of the method of manufacturing a single-layered transparent mixed negative photoresist material layer according to one embodiment of the present disclosure.

As shown in FIGS. 9 and 10, the composite negative photoresist material layer 34 is formed by mixing a transparent protective material and a negative photoresist material. The mixed negative photoresist material layer 34 is made by the following steps. Step S31: supplying a mixture of a transparent protective material and a negative photoresist material into a mold. Step S32: obtaining the mixed negative photoresist material layer which is in a transparent single-layered structure through a photo-curing procedure and a thermal-reaction method.

A mixture of the transparent protective material 321 and the negative photoresist material 331 is supplied into the mold. Through a photo-curing procedure and a thermal-reaction method, the composite negative photoresist material layer 31 which is in a transparent dual-layered structure is formed. It is helpful for the mass-production of the composite photoresist material and can further reduce the manufacturing cost. The disposing of the mixed negative photoresist material layer 34 can effectively substitute the transparent protective material and the negative photoresist material on the color filter layer 4. By adopting the half-tone masks or the gray-tone masks, the transparent photoresist layer 3 may be simply and conveniently formed through just one photo-masking process, which simplifies the manufacturing process.

Figure 11:
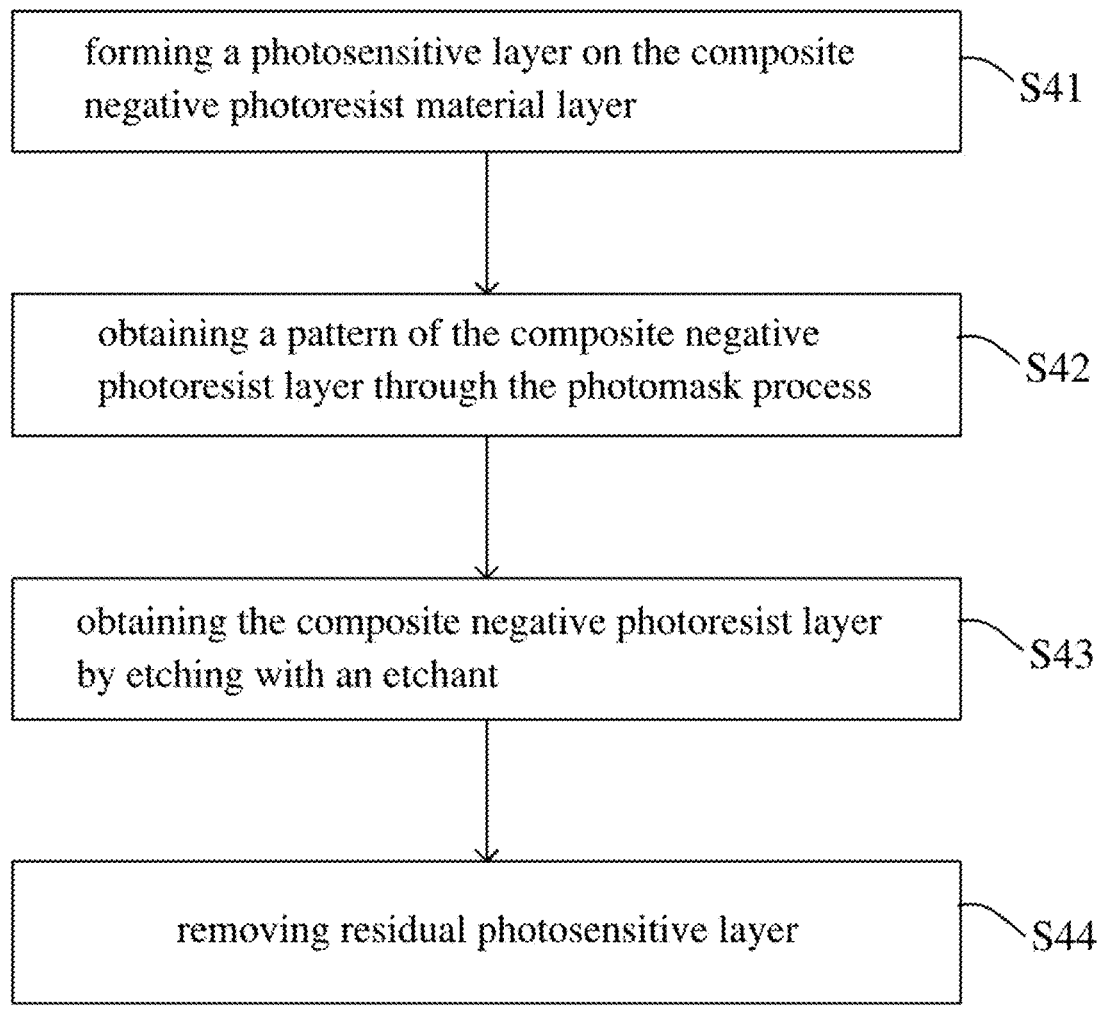
FIG. 11 is a flow chart of a method of manufacturing a display panel according to one embodiment of the present disclosure.

As shown in FIG. 11, during obtaining the transparent photoresist layer 3 which covers the color filter layer 4 through the photo-masking process, the method comprises the following steps. Step S41: forming a photosensitive layer on the composite negative photoresist layer or the mixed negative photoresist material layer. Step S42: obtaining a pattern of the transparent photoresist layer through the photo-masking process. Step S43: obtaining the transparent photoresist layer by etching with an etchant. Step S44: removing residual photosensitive layer.

A photosensitive layer is formed on the composite negative photoresist layer or the mixed negative photoresist material layer 34. The photosensitive layer is exposed through the photo-masking process so as to obtain the required pattern of the transparent photoresist layer 3. Later, the composite negative photosensitive layer is etched by an etchant (etching reagent), such that the transparent photoresist layer 3 is simply and conveniently obtained. Composite negative photoresist may have a function of effectively protecting the protective layer 5 and photo spacer 6. By using a washing reagent, the residual photosensitive layer remaining on the transparent photoresist layer 3 is removed. It facilitates the subsequent processing of the display panel. Later, other manufacturing processes are performed on the transparent photoresist layer 3, which helps to fabricate the display panel conveniently.

Figure 12:
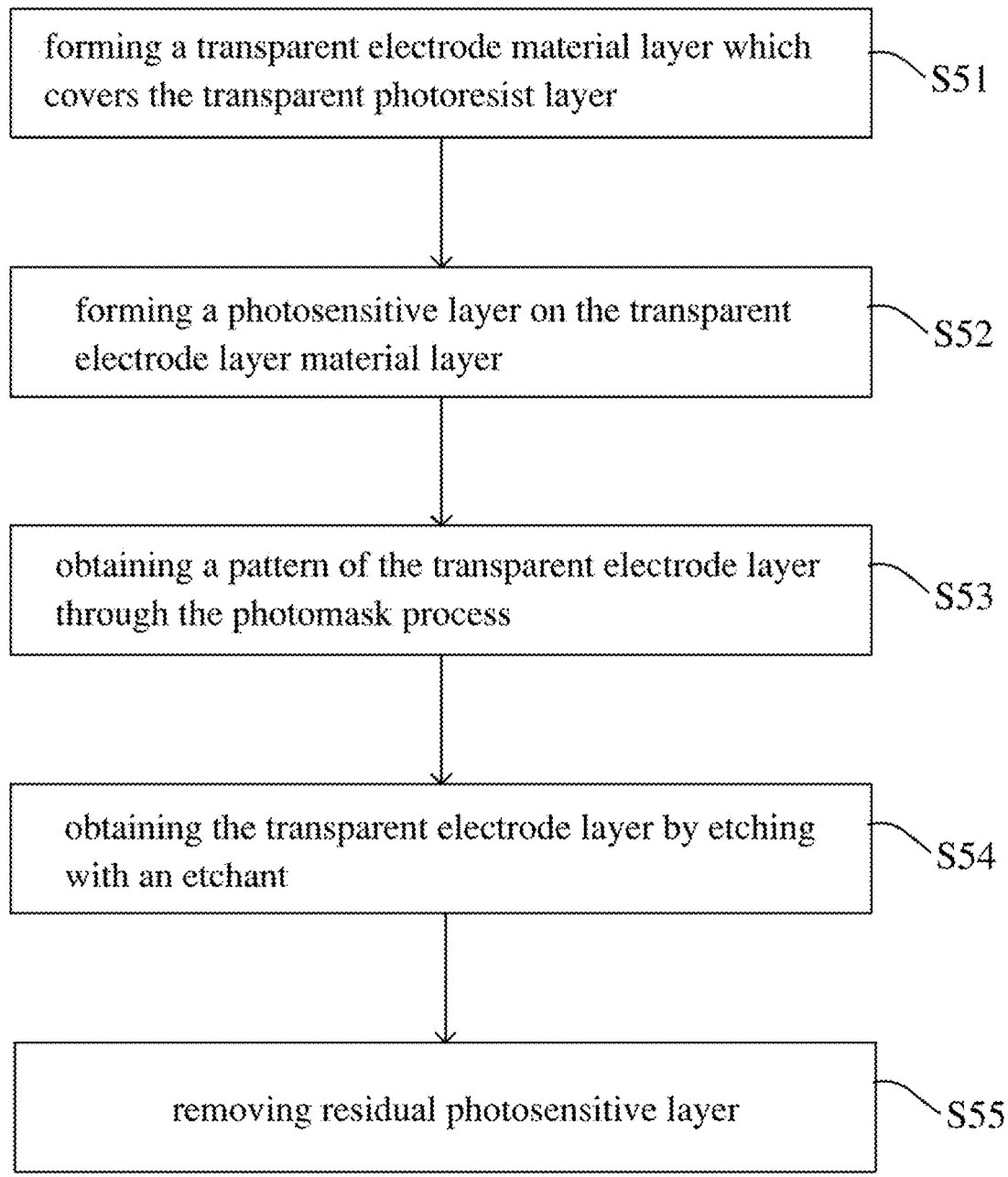
FIG. 12 a flow chart of a method of manufacturing a display panel according to one embodiment of the present disclosure.

As shown in FIG. 12, after obtaining the transparent photoresist layer 3 which covers the active switches 2 through the photo-masking process, the method further comprises the following steps. Step S51: forming a transparent electrode material layer which covers the transparent photoresist layer. Step S52: forming a photosensitive layer on the transparent electrode layer material layer. Step S53: obtaining a pattern of the transparent electrode layer through the photo-masking process. Step S54: obtaining the transparent electrode layer by etching with an etchant. Step S55: removing residual photosensitive layer.

The transparent electrode material layer is disposed on the transparent photoresist layer 3. Later, a photosensitive layer is formed on the transparent electrode material layer. The photosensitive layer is exposed through the photo-masking process so as to obtain the required pattern of the transparent electrode layer. Later, the transparent electrode material layer is etched by an etchant (etching reagent), and the transparent electrode material layer on the photo spacer 6 is also etched, such that the transparent electrode layer 7 is disposed so as to avoid the photo spacer 6. The interference between the transparent electrode layer 6 and the photo spacer 6 is effectively prevented, so as to secure the display effect of the display panel and to ensure that the transparent electrode layer 7 may work well. The disposing of the transparent electrode layer and the photo spacers is implemented through just two manufacturing processes, which may optimize and reduce the number of the manufacturing process of the display panel. Accordingly, the display panel can be manufactured more conveniently. It is beneficial to reduce the number of the manufacturing process and the manufacturing time of the display panel, which may further increase the production efficiency of the display panel.

Figure 13:
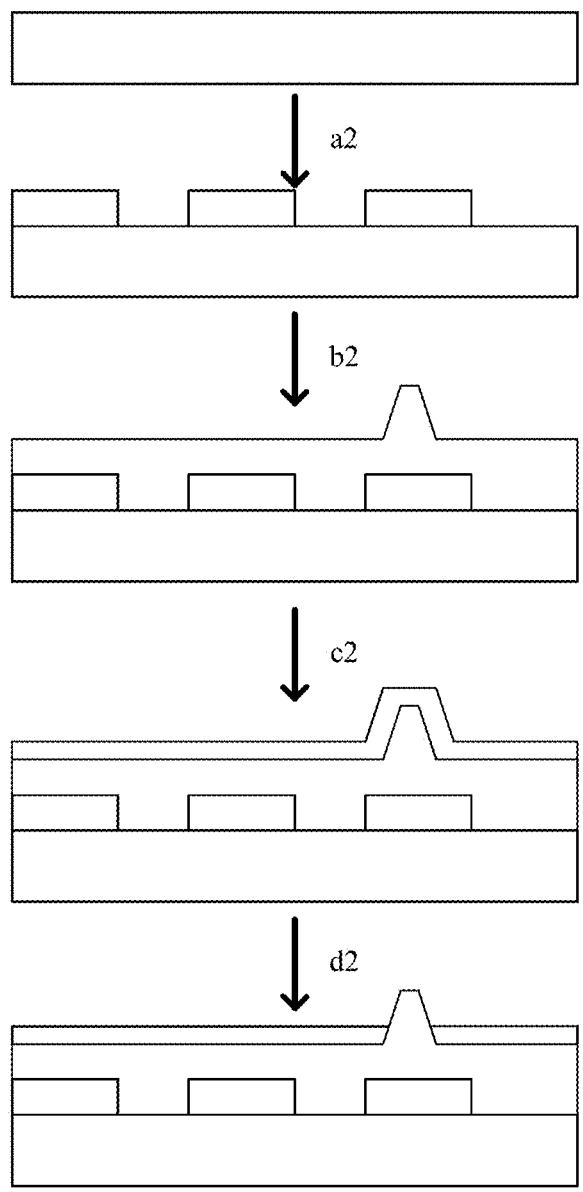
FIG. 13 is a flow chart of a method of manufacturing a display panel according to one embodiment of the present disclosure.

As shown in FIG. 13, the color filter layer 4 is formed through performing a color resist process a2 on the insulation layer 24. Later, the transparent photoresist layer 3 is formed through performing a composite negative photoresist process b2 on the color filter layer 4. The transparent photoresist layer 3 comprises the protective layer 5 and the photo spacer 6. Later, the transparent electrode material layer is formed through performing a sputtering method c2 for the transparent electrode layer on the protective layer 5. The transparent electrode layer 7 is formed through performing a lithographic process dl on the transparent electrode material layer. Performing a lithographic process on the transparent electrode material layer can etch the transparent electrode material layer on the photo spacer 6, such that the transparent electrode layer 7 is disposed so as to avoid the photo spacer 6.

According to another aspect of the present disclosure, a display device is further provided. The display device comprises the aforementioned display panel. The details regarding to the specific structures and connecting relationships of the components of the display panel may refer to the FIGS. 1 to 7, and therefore are omitted here.

In the above embodiments, the material of the substrate 11 can be selected from glass, plastic, and the like.

In the above embodiments, the display panel comprises a liquid crystal panel, a plasma panel and the likes. Taking a liquid crystal panel as an example, the liquid crystal panel comprises a TFT substrate (Thin Film Transistor Substrate) and a CF substrate (Color Filter Substrate). The TFT substrate is disposed opposite to the CF substrate. Thin film transistors (TFT) are disposed on the TFT substrate, and a color filter layer is disposed on the CF substrate.

In the above embodiments, the CF substrate can comprise a TFT array. The color filter and the TFT array can be formed on the same substrate. The TFT substrate can comprise a color filter layer.

In the above embodiments, the display panel of this disclosure can be a curved panel. The above contents with the specific embodiments of the present invention is further made to the detailed description, and specific embodiments of the present invention should not be considered limited to these descriptions. Those of ordinary skill in the art for the present invention, without departing from the spirit of the present invention, can make various simple deduction or replacement, and should be deemed to belong to the scope of the present invention.

What is claimed is:

1. A method of manufacturing a display panel, wherein the display panel comprises a substrate, a plurality of active switches disposed on the substrate and a color filter layer disposed on the active switches, comprising:
   disposing a composite negative photoresist material layer or a mixed negative photoresist material layer on the color filter layer; and
   obtaining a transparent photoresist layer which covers the color filter layer through a photo-masking process,
   wherein during obtaining the transparent photoresist layer which covers the color filter layer through the photo-masking process, the method comprises:
   forming a photosensitive layer on the composite negative photoresist material layer;
   obtaining a pattern of the transparent photoresist layer through the photo-masking process;
   obtaining the transparent photoresist layer by etching with an etchant; and
   removing residual photosensitive layer.

2. The method of manufacturing the display panel according to claim 1, wherein the mixed negative photoresist material layer is formed by mixing of a transparent protective material and a negative photoresist material, and the mixed negative photoresist material layer is made by the steps of:
   supplying a mixture of the transparent protective material and the negative photoresist material into a mold; and
   obtaining the mixed negative photoresist material layer which is in a transparent single-layered structure through a photo-curing procedure and a thermal-reaction method.

3. The method of manufacturing the display panel according to claim 1, wherein photomask used in the photo-making process is a half-tone mask or a gray-tone mask.

4. The method of manufacturing the display panel according to claim 1, wherein after obtaining the transparent photoresist layer which covers the active switches through the photo-masking process, the method further comprises:
   forming a transparent electrode material layer which covers the transparent photoresist layer;
   forming a photosensitive layer on the transparent electrode material layer;
   obtaining a pattern of a transparent electrode layer through the photo-masking process;
   obtaining the transparent electrode layer by etching with an etchant; and
   removing residual photosensitive layer.

5. The method of manufacturing the display panel according to claim 1, wherein the composite negative photoresist material layer comprises a transparent protective layer and a negative photoresist layer, and the composite negative photoresist material layer is made by the steps of:
  supplying a transparent protective material to a bottom of a mold;
  supplying a negative photoresist material on the transparent protective material in the mold; and
  obtaining the composite negative photoresist material layer which is in a transparent dual-layered structure through a photo-curing procedure and a thermal-reaction method.

6. The method of manufacturing the display panel according to claim 5, wherein the transparent protective layer and the negative photoresist layer are disposed in a stacked manner.

7. The method of manufacturing the display panel according to claim 1, wherein the transparent photoresist layer comprises a protective layer and at least one photo spacer.

8. The method of manufacturing the display panel according to claim 7, wherein a transparent electrode layer is disposed on the transparent photoresist layer, and the photo spacer is disposed in a manner of penetrating through the transparent electrode layer.

9. A method of manufacturing a display panel, wherein the display panel comprises a substrate, a plurality of active switches disposed on the substrate and a color filter layer disposed on the active switches, comprising:
  disposing a composite negative photoresist material layer or a mixed negative photoresist material layer on the color filter layer; and
  obtaining a transparent photoresist layer which covers the color filter layer through a photo-masking process,
  wherein during obtaining the transparent photoresist layer which covers the color filter layer through the photo-masking process, the method comprises:
  forming a photosensitive layer on the mixed negative photoresist material layer;
  obtaining a pattern of the transparent photoresist layer through the photo-masking process;
  obtaining the transparent photoresist layer by etching with an etchant; and
  removing residual photosensitive layer.

\* \* \* \* \*